(12) United States Patent
Jain et al.

(10) Patent No.: US 11,848,192 B2
(45) Date of Patent: Dec. 19, 2023

(54) HETEROJUNCTION BIPOLAR TRANSISTOR WITH EMITTER BASE JUNCTION OXIDE INTERFACE

(71) Applicant: GLOBALFOUNDRIES U.S. Inc., Santa Clara, CA (US)

(72) Inventors: Vibhor Jain, Essex Junction, VT (US); Anthony K. Stamper, Burlington, VT (US); Steven M. Shank, Jericho, VT (US); John J. Pekarik, Underhill, VT (US)

(73) Assignee: GLOBALFOUNDRIES U.S. INC., Malta, NY (US)

(*) Notice: Subject to any disclaimer, the term of this patent is extended or adjusted under 35 U.S.C. 154(b) by 295 days.

(21) Appl. No.: 17/124,012

(22) Filed: Dec. 16, 2020

(65) Prior Publication Data

US 2021/0104621 A1 Apr. 8, 2021

Related U.S. Application Data

(63) Continuation of application No. 16/388,500, filed on Apr. 18, 2019, now Pat. No. 10,916,642.

(51) Int. Cl.
*H01L 29/737* (2006.01)
*H01L 29/06* (2006.01)

(52) U.S. Cl.
CPC ...... *H01L 29/7373* (2013.01); *H01L 29/0649* (2013.01); *H01L 29/7371* (2013.01)

(58) Field of Classification Search
CPC ............. H01L 29/7306; H01L 29/7373; H01L 29/7371; H01L 29/737
See application file for complete search history.

(56) References Cited

U.S. PATENT DOCUMENTS

| | | | |
|---|---|---|---|
| 5,365,090 A * | 11/1994 | Taka | H01L 29/66242 257/514 |
| 6,656,809 B2 | 12/2003 | Greenberg et al. | |
| 7,202,494 B2 | 4/2007 | Blanchard et al. | |
| 7,279,701 B2 | 10/2007 | Kreps | |
| 7,433,729 B2 | 10/2008 | Setlak et al. | |

(Continued)

OTHER PUBLICATIONS

Valant, T. "Monolayer—Controlled Deposition of Silicon Oxide Films on Gold, Silicon, and Mica Substrates by Room-Temperature Adsorption and Oxidation of Alkylsiloxane Monolayers" J. Phys. Chem B 2000 104 published online May 13, 2000 pp. 5309-5317 (Year: 2000).*

(Continued)

*Primary Examiner* — Grant S Withers
(74) *Attorney, Agent, or Firm* — Francois Pagette; Andrew M. Calderon; Calderon Safran & Cole P.C.

(57) ABSTRACT

The present disclosure relates to semiconductor structures and, more particularly, to a heterojunction bipolar transistor having an emitter base junction with a silicon-oxygen lattice interface and methods of manufacture. The device includes: a collector region buried in a substrate; shallow trench isolation regions, which isolate the collector region buried in the substrate; a base region on the substrate and over the collector region; an emitter region composed of a single crystalline of semiconductor material and located over with the base region; and an oxide interface at a junction of the emitter region and the base region.

14 Claims, 3 Drawing Sheets

(56) References Cited

U.S. PATENT DOCUMENTS

| | | |
|---|---|---|
| 7,439,558 B2 | 10/2008 | Enicks |
| 7,446,002 B2 | 11/2008 | Mears et al. |
| 7,517,702 B2 | 4/2009 | Halilov et al. |
| 7,531,828 B2 | 5/2009 | Mears et al. |
| 7,531,829 B2 | 5/2009 | Blanchard |
| 7,535,041 B2 | 5/2009 | Blanchard |
| 7,598,515 B2 | 10/2009 | Mears et al. |
| 7,781,827 B2 | 8/2010 | Rao |
| 8,482,101 B2 | 7/2013 | Benoit et al. |
| 8,866,154 B2 | 10/2014 | Ma et al. |
| 9,899,479 B2 | 2/2018 | Mears et al. |
| 10,068,997 B1 | 9/2018 | Preisler |
| 10,186,605 B1 | 1/2019 | Gauthier et al. |
| 2002/0027232 A1 | 3/2002 | Shigematsu et al. |
| 2003/0132453 A1* | 7/2003 | Greenberg ........ H01L 29/66242 438/312 |
| 2004/0266116 A1 | 12/2004 | Mears et al. |
| 2006/0220118 A1 | 10/2006 | Stephenson et al. |
| 2006/0249813 A1 | 11/2006 | Dunn et al. |
| 2006/0273299 A1 | 12/2006 | Stephenson et al. |
| 2007/0015344 A1 | 1/2007 | Mears et al. |
| 2009/0065804 A1* | 3/2009 | Pagette ............... H01L 29/7371 257/190 |
| 2010/0283084 A1 | 11/2010 | Ohnishi et al. |
| 2012/0049327 A1 | 3/2012 | Qian et al. |
| 2013/0270649 A1 | 10/2013 | Chantre et al. |
| 2014/0117493 A1 | 5/2014 | Cheng et al. |
| 2014/0151852 A1 | 6/2014 | Adkisson et al. |
| 2014/0246676 A1 | 9/2014 | Camillo-Castillo et al. |
| 2014/0264341 A1 | 9/2014 | Camillo-Castillo et al. |
| 2014/0264457 A1 | 9/2014 | Preisler et al. |
| 2014/0264458 A1 | 9/2014 | Preisler et al. |
| 2014/0353725 A1 | 12/2014 | Adkisson et al. |
| 2014/0361300 A1 | 12/2014 | Camillo-Castillo et al. |
| 2017/0236923 A1 | 8/2017 | Chevalier |
| 2017/0278955 A1 | 9/2017 | Jain et al. |
| 2018/0040743 A1 | 2/2018 | Mears et al. |
| 2018/0175182 A1 | 6/2018 | Kawai |
| 2019/0326411 A1 | 10/2019 | Jain et al. |

OTHER PUBLICATIONS

Green Rhino Energy ("PV manufacturing" online article by Green Rhino Energy company published Aug. 2018 see online archived version at http://www.greenrhinoenergy.com/solar/technologies/pv_manufacturing.php) (Year: 2018).*

Simoen et al., "Deep levels in silicon-oxygen superlattices", IOP Publishing, Semiconductor Science and Technology, 2016, 10 pages.

* cited by examiner

HETEROJUNCTION BIPOLAR TRANSISTOR WITH EMITTER BASE JUNCTION OXIDE INTERFACE

FIELD OF THE INVENTION

The present disclosure relates to semiconductor structures and, more particularly, to a heterojunction bipolar transistor having an emitter base junction with a silicon-oxygen lattice interface and methods of manufacture.

BACKGROUND

A heterojunction bipolar transistor (HBT) is a type of bipolar junction transistor (BJT) which uses differing semiconductor materials for the emitter and base regions or collector and base regions, creating a heterojunction. Si/SiGe HBTs are used in power amplifier applications and require low emitter-base capacitance Cbe (e.g., tight doping control and diffusion), low emitter resistance Re (e.g., high doping in emitter and single crystal emitter) and low beta variation (e.g., controlled dopant diffusion). In conventional devices these characteristics can be achieved by forming poly-silicon emitters over a single crystal base.

The polySi emitters generally have higher Re, with some diffusion control of the emitter dopants into the base due to interface properties. Another approach includes using a clean emitter-base interface with lower emitter doping to control emitter diffusion but results in higher Re.

SUMMARY

In an aspect of the disclosure, a device comprises: a collector region buried in a substrate; shallow trench isolation regions, which isolate the collector region buried in the substrate; a base region on the substrate and over the collector region; an emitter region composed of a single crystalline of semiconductor material and located over with the base region; and an oxide interface at a junction of the emitter region and the base region.

In an aspect of the disclosure, a bipolar device comprises: a collector region in a semiconductor material; a single crystalline semiconductor base on the semiconductor material and over the collector region; a single crystal semiconductor emitter over the single crystalline semiconductor base; and an oxide at a junction between the single crystalline semiconductor base and the single crystal semiconductor emitter.

In an aspect of the disclosure, a method comprises: forming a collector region in a semiconductor material; forming a single crystalline semiconductor base on the semiconductor material and over the collector region; forming a single crystal semiconductor emitter over the single crystalline semiconductor base; and forming an oxide interface at a junction between the single crystalline semiconductor base and the single crystal semiconductor emitter.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to a heterojunction bipolar transistor having an emitter base junction with a silicon-oxygen lattice interface and methods of manufacture. More specifically, the present disclosure relates to an emitter base junction in a SiGe heterojunction bipolar transistor (HBT) with a silicon-oxygen interface. Advantageously, the present disclosure provides improved beta control for power applications in SiGe (i.e., tighter beta variation) with low Re and Cbe.

The emitter base junction with silicon-oxygen lattice structures of the present disclosure can be manufactured in a number of ways using a number of different tools. In general, though, the methodologies and tools are used to form structures with dimensions in the micrometer and nanometer scale. The methodologies, i.e., technologies, employed to manufacture the emitter base junction with silicon-oxygen lattice structures of the present disclosure have been adopted from integrated circuit (IC) technology. For example, the structures are built on wafers and are realized in films of material patterned by photolithographic processes on the top of a wafer. In particular, the fabrication of the emitter base junction with silicon-oxygen lattice structures use three basic building blocks: (i) deposition of thin films of material on a substrate, (ii) applying a patterned mask on top of the films by photolithographic imaging, and (iii) etching the films selectively to the mask.

Figure 1:
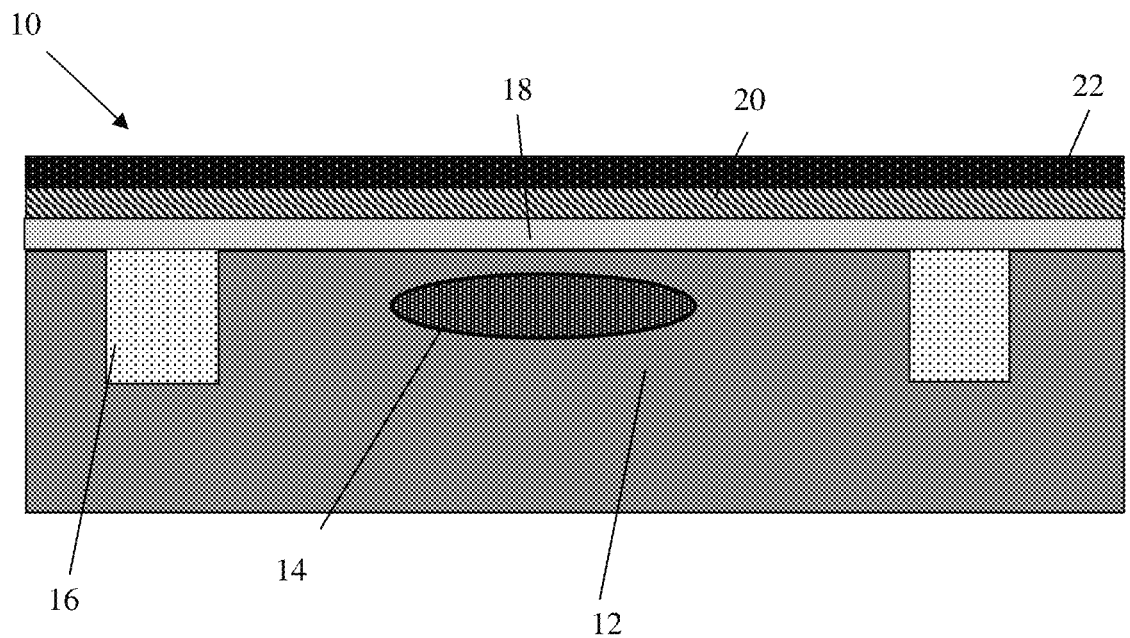
FIG. 1 shows a structure with a collector region, amongst other features, and respective fabrication processes in accordance with aspects of the present disclosure.

FIG. 1 shows a structure with a collector region, amongst other features, and respective fabrication processes in accordance with aspects of the present disclosure. In embodiments, the structure 10 includes a substrate 12 composed of semiconductor material, e.g., Si; although other substrate materials are also contemplated herein, e.g., SiGe, SiGeC, SiC, GaAs, InAs, InP, and other III/V or II/VI compound semiconductors. In embodiments, the substrate 12 can be doped with an n-type dopant to form a subcollector region (not shown in the figures). A collector region 14 is formed within the substrate 12. In embodiments, the collector region 14 is a highly doped n-type collector region. The collector region 14 can be formed by an ion implantation process or a n-doped epitaxial process, both of which are known to those of ordinary skill in the art such that no further explanation is required for a complete understanding of the present disclosure.

Still referring to FIG. 1, the structure 10 further includes shallow trench isolation structures 16 formed in the substrate 12 and isolating the collector region 14. In embodiments, the shallow trench isolation structures 16 are composed of oxide material formed by conventional lithography, etching and deposition processes. For example, a resist formed over the substrate 12 is exposed to energy (light) to form a pattern (opening). An etching process with a selective chemistry, e.g., reactive ion etching (RIE), will be used to form trenches in the substrate 12 through the openings of the resist. The resist can then be removed by a conventional oxygen ashing process or other known stripants. Following the resist removal, insulator material is deposited within the trenches by any conventional deposition processes, e.g., chemical vapor deposition (CVD) process. Any residual material on the surface of the substrate 12 can be removed by conventional chemical mechanical polishing (CMP) processes.

FIG. 1 further shows a base region 18 (of an HBT) formed on the substrate 12 and over shallow trench isolation structures 16. In embodiments, the base region 18 is composed of single crystalline semiconductor material, e.g., SiGe/Si material. In embodiments, the base region 18 can be composed of multiple layers such as single crystalline Si, single crystalline SiGe, followed by Ge, carbon (C) and/or boron (B), and completed with a layer of a single crystalline Si material, as one illustrative non-limiting example. The base region 18 can be formed by conventional epitaxial growth processes to a thickness of about 400 Å to 4000 Å.

An oxide material 20 is formed over the base region 18. In embodiments, the oxide material 20 can be a high temperature oxide that is deposited or grown using conventional processes such that no further explanation is required for a complete understanding of the present disclosure. In embodiments, the oxide material 20 can have a thickness of about 50 Å to 1000 Å; although other dimensions are also contemplated herein. A material 22, e.g., nitride, is deposited over the oxide material 20. In embodiments, the material 22 is deposited by a conventional CVD process, thicker than the oxide material 20. For example, the thickness of the material 22 can be about 100 Å to 2000 Å; although other dimensions are also contemplated herein.

Figure 2:
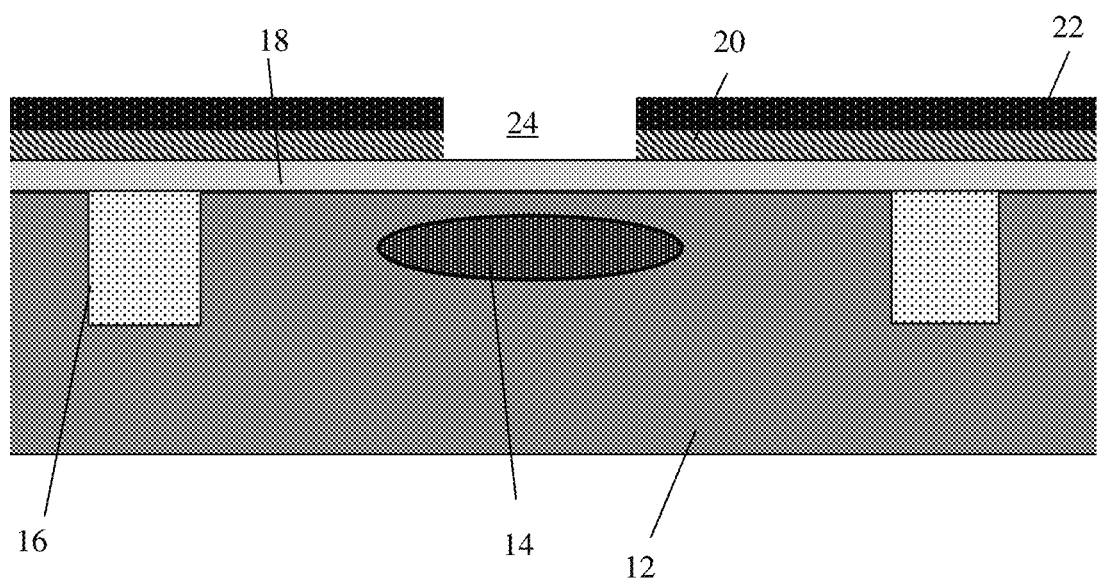
FIG. 2 shows an emitter opening exposing a base region, amongst other features, and respective fabrication processes in accordance with aspects of the present disclosure.

FIG. 2 shows an emitter opening 24 formed in the oxide material 20 and material 22, stopping on the material of the base region 18. In embodiments, the emitter opening 24 is aligned with and is over the collector region 14. The emitter opening 24 can be formed by two separate selective etching processes; a first etching process for the material 22 and second etching process for the oxide layer 20. The etching processes can be dry etching processes; although wet etching processes are also contemplated herein.

Figure 3:
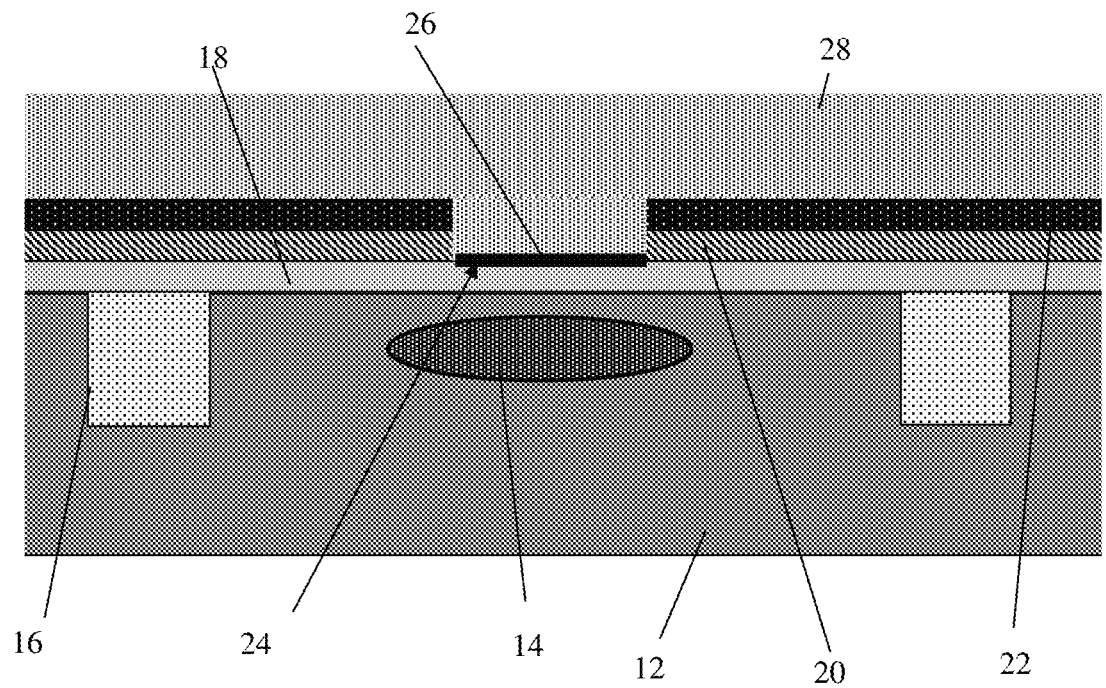
FIG. 3 shows an oxide interface between the base region and an emitter region, amongst other features, and respective fabrication processes in accordance with aspects of the present disclosure.

FIG. 3 shows an emitter material 28 (of an HBT) and an oxide interface 26 between the base 18 and emitter material 28. The oxide interface 26 is an oxide at the emitter base junction. More specifically, the emitter material 28 is formed in the emitter opening 24 by a deposition or growth process as further described herein. In embodiments, the oxide interface 26 is a sub-monolayer of oxide with a thickness of 5 Å or less, which is formed at the interface of emitter material 28 and the base region 18. The oxide interface 26 can be formed by an epitaxial growth process.

In alternative embodiments, the oxide interface 26 can be composed of a super-lattice of oxygen formed by methods known in the art such that no further explanation is required herein for a complete understanding of the disclosure. The thickness of the super-lattice should preferably not exceed 5 Å. By way of example, the oxygen-silicon growth can be performed in ALD (Atomic Layer Deposition) and CVD (Chemical Vapor Deposition) chambers. An atomic layer of oxygen can be deposited in an ALD tool followed by silicon growth or deposition in a CVD tool. Both the tools could be connected in-situ using a low pressure (vacuum) transfer chamber. The wafers can be transferred back and forth between the two tools without breaking vacuum for a good quality film growth.

Figure 4:
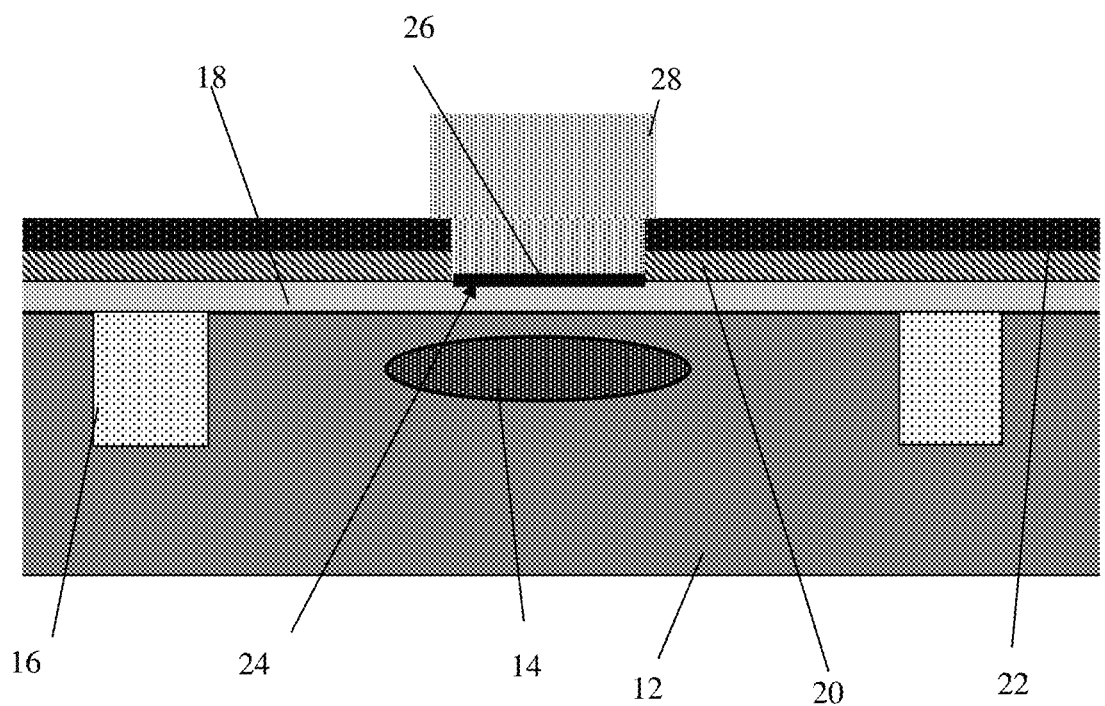
FIG. 4 shows the emitter region formed by a selective grown process in accordance with aspects of the present disclosure.

In embodiments, the emitter material 28 is Si material or SiGe material or a combination thereof. The emitter material 28 can be formed by a non-selective growth process, e.g., grows both within the emitter opening 24 and on the nitride material 22. In alternative approaches, though, the emitter material 28 can be formed by selective growth process, e.g., only within the emitter opening 24 (as shown in FIG. 4). In further embodiments, the emitter material 28 can be formed by a combination of selective and non-selective growth processes.

In embodiments, the emitter material 28 is a single crystalline doped Si material. In embodiments, the emitter material 28 can also include SiGe material, e.g., 10%-15% Ge material. The doping of the emitter material 28 can be an N+ type doping with different doping concentrations, i.e., less doping in the lower regions, e.g., 50 Å to 500 Å, for lower capacitance and higher doping on a top portion for improved via contact characteristics. For example, the doping concentration can be 1e21 in a top portion and 1e20 to 1e21 in the lower portion. Accordingly, in embodiments, the silicon-oxygen-single crystal lattice (e.g., base 18, oxide interface 26, emitter material 28) provides for improved beta control and diffusion.

Figure 5:
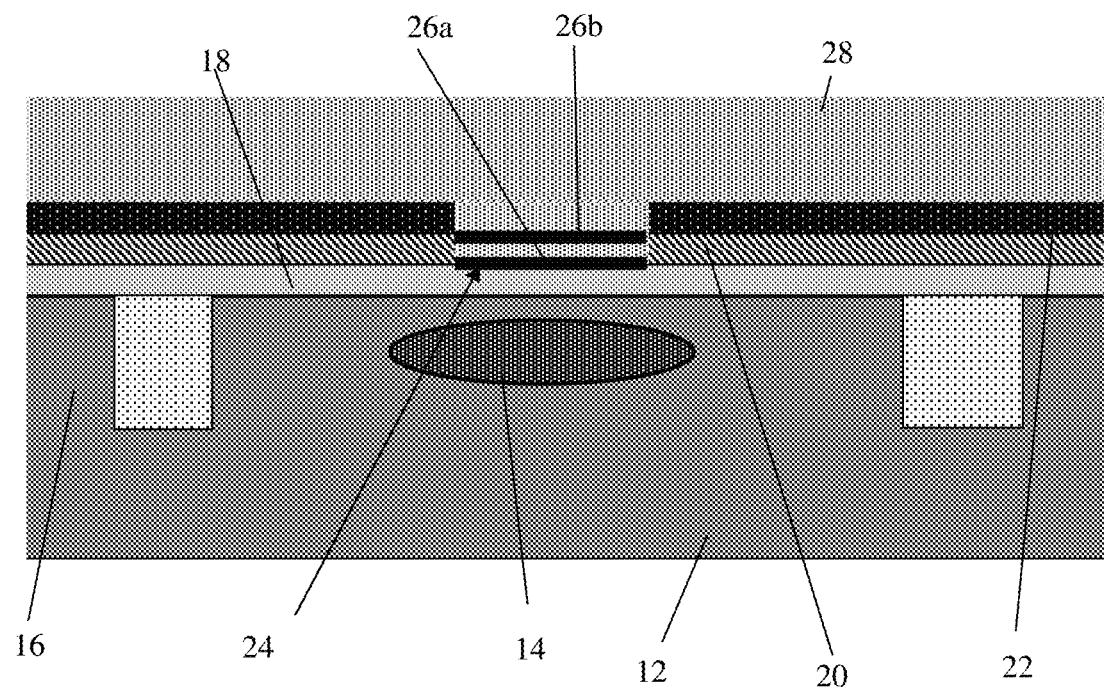
FIG. 5 shows oxide interfaces in the emitter and emitter-base junction, amongst other features, and respective fabrication processes in accordance with aspects of the present disclosure.

FIG. 5 shows a multiple oxide interfaces 26a, 26b in accordance with aspects of the present disclosure. In this embodiment, oxygen (oxide interfaces) is incorporated in the lattice of the emitter material 28 in more than one location. More specifically, a sub-mono-layer oxide is provided at the emitter base junction (e.g., oxide interface 26a) and within the single crystal emitter 28 (e.g., oxide interface 26b). The oxygen provided at the bottom interface 26a provides improved beta control; whereas, the oxygen incorporated within the emitter material 28, e.g., the second interface 26b within the emitter material 28, provides improved Cbe.

In embodiments, both interfaces 26a, 26b can be a monolayer of oxygen (e.g., 5 Å or less) or a super-lattice as described with respect to FIG. 3. The multiple oxide interfaces 26a, 26b are preferably spaced apart by 10 Å; although smaller distances are also contemplated by the present disclosure depending on the desired electrical characteristics required by the device. Moreover, doping of the epitaxial layer, e.g., emitter material 28, can be different between the two oxygen films, e.g., oxide interfaces 26a, 26b, compared to the layer above the top oxygen layer 26b. For example, the doping concentration can be 1e21 at a top portion of the emitter material and 4e20 to 1e21 between the oxide interfaces 26a, 26b.

Figure 6:
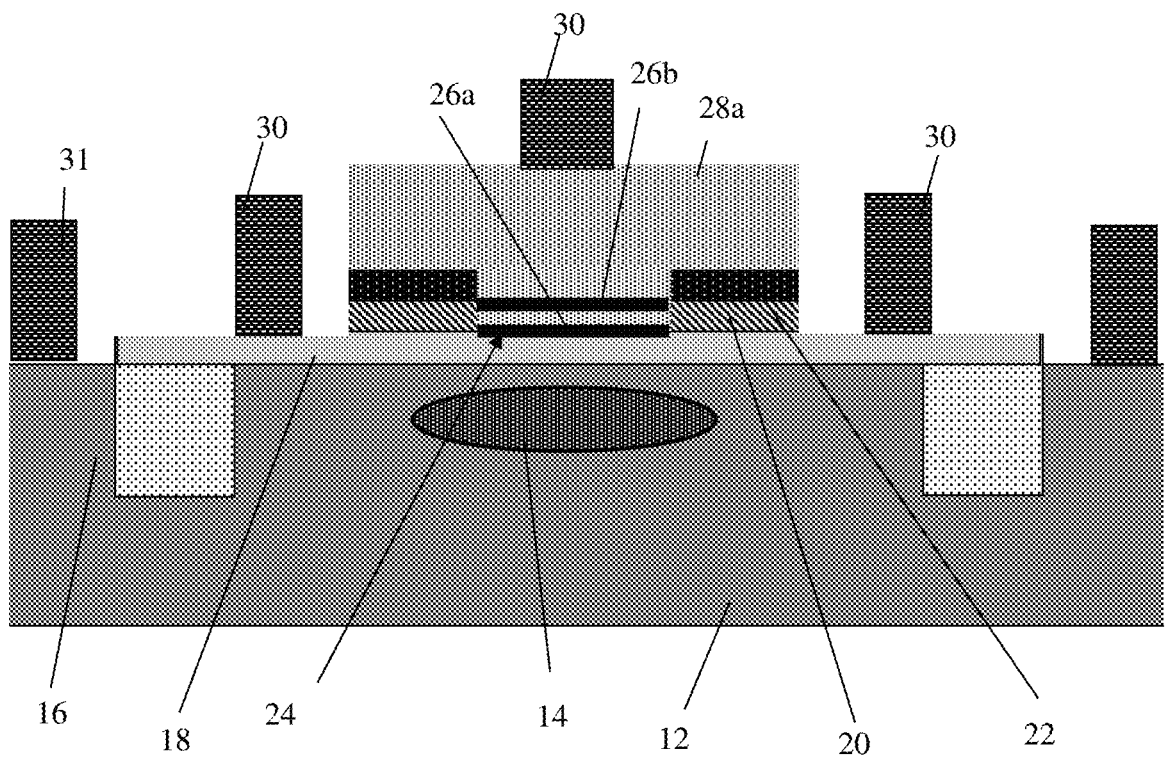
FIG. 6 shows contacts to the emitter region and base, amongst other features, and respective fabrication processes in accordance with aspects of the present disclosure.

Accordingly, in embodiments, the silicon-oxygen-single crystal lattice (e.g., base 18, oxide interface 26, emitter material 28) provides for improved beta control and diffusion. More specifically, the oxygen-silicon interface, e.g., super-lattice, is used in the emitter-base junction to control doping profiles in the emitter region for tight beta control, reduced Cbe, lower Re and for optimizing beta-temperature behavior. Also, SiGe material will benefit by having narrow abrupt junctions for higher fT while maintaining good Re and BVebo FIG. 6 shows contacts 30 in electrical and physical contact with the emitter region 28a and the base region 18. Prior to forming the contacts 30, in the embodiment using the non-selective growth process, the emitter material 28 is patterned using conventional lithography and etching processes to form the emitter region 28a. In the selective growth process, this patterning step can be omitted. Once the emitter region 28*a* is formed (by either patterning or selective growth processes), the oxide material 20 and nitride material 22 are patterned, exposing the base region 18 on sides of the emitter region 28*a*. Following this patterning, the contacts 30 are formed on the base region 18 and the emitter region 28*a*. In embodiments, one or multiple contacts 30 can be provided on the base region 18. The contacts 31 contact the collector region 14. The contacts 30, 31 can be formed by deposition of metal material, e.g., conductive material, followed by lithography and etching steps as already described herein.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A device comprising:
a collector region comprising a doped region in a semiconductor substrate;
a base region over the collector region;
an emitter region comprising a single crystalline semiconductor material located over the base region; and
an oxide interface comprising a super-lattice of silicon and oxygen at a junction of the emitter region and the base region.

2. The device of claim 1, wherein the base region includes a second single crystalline semiconductor material and the single crystalline semiconductor material comprises a thickness greater than an underlying insulator layer to extend above a height of a trench.

3. The device of claim 2, wherein the emitter region and base region comprise Si or SiGe or a combination thereof.

4. The device of claim 1, wherein the emitter region is a doped semiconductor material with different doping concentrations along its height.

5. The device of claim 1, further comprising a second oxide interface within the emitter region, above the oxide interface.

6. The device of claim 5, wherein the emitter region is a doped semiconductor material having a first concentration between the oxide interface and the second oxide interface, and a second concentration at a top portion thereof.

7. The device of claim 1, wherein the collector region is provided between shallow trench isolation structures extending from an underside of the base region, the collector region being remotely positioned and not in direct contact with the shallow trench isolation structures.

8. The device of claim 7, wherein the collector region is separated from the shallow trench isolation structures by semiconductor substrate material.

9. A device comprising:
a collector region comprising a doped region in a semiconductor substrate;
a base region over the collector region;
an emitter region comprising a single crystalline semiconductor material located over the base region; and
an oxide interface comprising a sub-monolayer oxide or super-lattice of oxygen at a junction of the emitter region and the base region,
a second oxide interface within the emitter region, above the oxide interface,
wherein the emitter region is a doped semiconductor material having a first concentration between the oxide interface and the second oxide interface, and a second concentration at a top portion thereof, and
wherein the second oxide interface is a sub-monolayer oxide or super-lattice of oxygen.

10. A bipolar device, comprising:
a collector region comprising a doped region in a semiconductor substrate;
a base over the collector region;
a single crystal semiconductor emitter over the base; and
an oxide at a junction comprising a sub-monolayer oxide or super-lattice of oxygen between the base and the emitter,
wherein the sub-monolayer oxide is provided at an emitter base junction and within the single crystal semiconductor emitter.

11. The bipolar device of claim 10, wherein the base includes a single crystalline semiconductor base composed of SiGe.

12. The bipolar device of claim 10, wherein the single crystal semiconductor emitter includes Si or SiGe or a combination thereof.

13. The bipolar device of claim 10, wherein the emitter has different dopant concentrations, a first of the dopant concentrations provided between the sub-monolayer oxide at the emitter base junction and within the single crystal emitter and a second of the dopant concentrations at a top portion of the single crystal semiconductor emitter.

14. A device comprising:
a collector region comprising a doped region in a semiconductor substrate;
a base region over the collector region;
an emitter region located over the base region;
insulator material on sides of the emitter region; and
an oxide interface comprises a super-lattice of silicon and oxygen at an interface of the emitter region and the base region.

* * * * *